United States Patent
Kang et al.

[11] Patent Number: 6,139,700
[45] Date of Patent: Oct. 31, 2000

[54] METHOD OF AND APPARATUS FOR FORMING A METAL INTERCONNECTION IN THE CONTACT HOLE OF A SEMICONDUCTOR DEVICE

[75] Inventors: Sang-Bom Kang, Seoul; Sang-In Lee, Kyunggi-do, both of Rep. of Korea

[73] Assignee: Samsung Electronics Co., Ltd., Suwon, Rep. of Korea

[21] Appl. No.: 09/163,479

[22] Filed: Sep. 30, 1998

[30] Foreign Application Priority Data

Oct. 1, 1997 [KR] Rep. of Korea ............... 97-50830

[51] Int. Cl.[7] ................ H01L 23/48; H01L 23/52; H01L 23/532; C23C 14/34; C23C 16/44
[52] U.S. Cl. .............. 204/192.17; 204/192.15; 204/192.22; 204/298.12; 204/298.13; 204/298.25; 204/298.28; 204/298.27; 118/728; 118/729; 118/730; 118/723 MP; 118/723 E; 438/602; 438/618; 438/622; 438/624; 438/637; 438/648; 438/656; 438/643; 438/653; 438/685; 427/585; 427/523
[58] Field of Search ............... 204/192.15, 192.17, 204/192.22, 298.12, 298.13, 298.25, 298.28, 298.27; 118/728, 729, 730, 723 MP, 723 E; 438/602, 618, 622, 624, 637, 648, 656, 643, 653, 685; 427/585, 523

[56] References Cited

U.S. PATENT DOCUMENTS

| | | |
|---|---|---|
| 4,058,430 | 11/1977 | Suntola et al. |
| 5,288,379 | 2/1994 | Namiki et al. ............ 204/192.12 |
| 5,338,423 | 8/1994 | Hindman et al. .......... 204/192.12 |
| 5,780,908 | 7/1998 | Sekiguchi et al. ............. 257/383 |
| 5,858,184 | 1/1999 | Fu et al. ..................... 204/192.17 |
| 5,873,942 | 2/1999 | Park et al. ..................... 118/719 |
| 5,911,857 | 6/1999 | Kim ............................ 205/192.15 |
| 5,973,402 | 10/1999 | Shinriki et al. ................ 257/768 |
| 5,998,870 | 12/1999 | Lee et al. ...................... 257/751 |

OTHER PUBLICATIONS

Mikko Ritala et al., "Atomic Layer Epitaxy Growth of TiN Thin Films," J. Electrochem. So., vol. 142, No. 8, Aug. 1995, pp. 2731–2737.

Steven D. Marcus et al., "Characterization of low pressure chemically vapor–deposited tungsten nitride films", Thin Solid Films, 236 (1993), pp. 330–333, (month unknown).

Primary Examiner—Alan Diamond
Attorney, Agent, or Firm—Jones Volentine, LLC

[57] ABSTRACT

A method and an apparatus of fabricating a metal interconnection in a contact hole of a semiconductor device reduces contact resistance and improves step coverage. A contact hole is opened in an interlayer insulating film formed on a semiconductor substrate. A conductive layer used as an ohmic contact layer is formed on the interlayer insulating film including the contact hole. An upper surface of the conductive layer is nitrided to form a protective layer. An ALD (atomic layer deposition)-metal barrier layer is formed on the protective layer. The resulting metal barrier layer has good step coverage and no impurities, and the protective layer prevents defects in the conductive layer caused by precursor impurities used during the formation of the metal barrier layer.

16 Claims, 6 Drawing Sheets

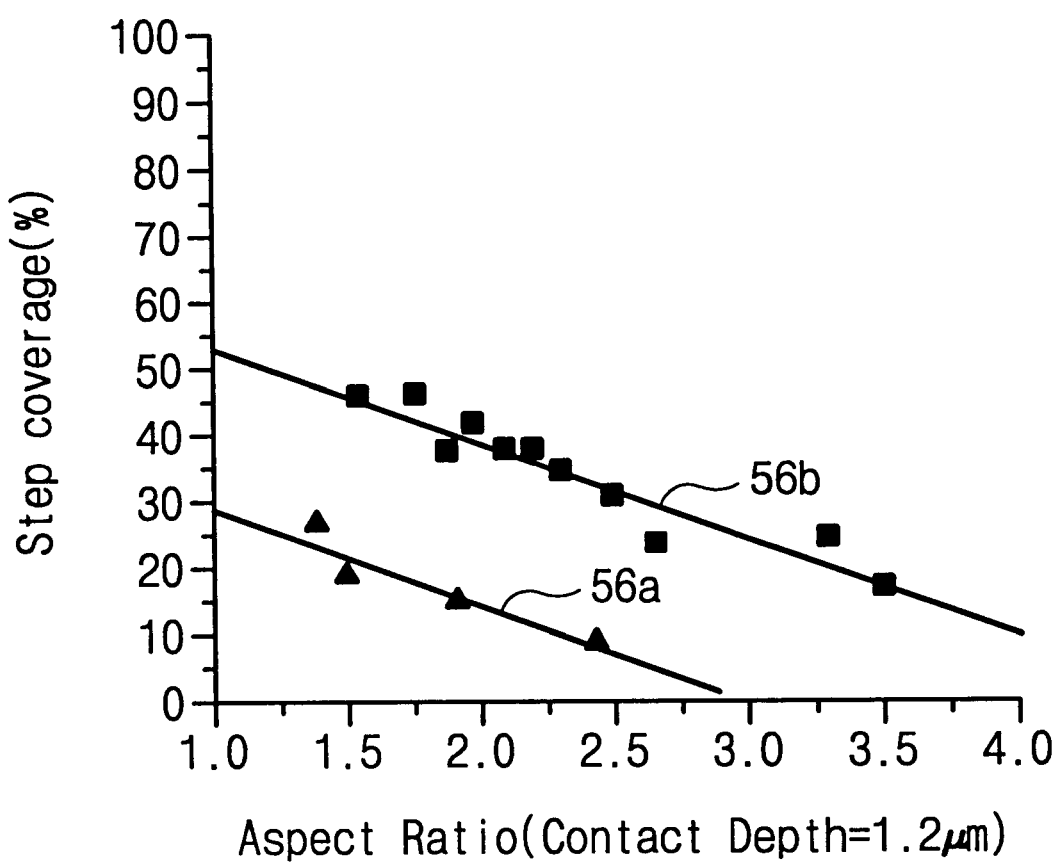

METHOD OF AND APPARATUS FOR FORMING A METAL INTERCONNECTION IN THE CONTACT HOLE OF A SEMICONDUCTOR DEVICE

FIELD OF THE INVENTION

The present invention relates to a method of fabricating a semiconductor device and an apparatus of fabricating the same, and more particularly to a method and an apparatus of fabricating a metal interconnection in a contact hole.

BACKGROUND OF THE INVENTION

As the degree of integration of semiconductor devices increases, the size of the contact holes becomes increasingly smaller. Such contact holes in these highly integrated devices inevitably have a high aspect ratio, that is, a smaller layer opening area compared with the depth of the hole through the layer. Accordingly, it is important that contact hole filling materials, used for example in an ohmic contact conductive layer/metal barrier layer structure, have good step coverage. Therefore, there is a continuing need for improved processing steps for depositing a thin film and for controlling the thickness of the thin film by controlling the deposition rate, thereby repeatedly depositing the thin film within a tolerance measured by Å units.

Generally, Ti (titanium)/TiN (titanium nitride) layers or Ti (titanium)/WN (tungsten nitride) layers are widely used for the ohmic contact conductive layer/metal barrier layer. The Ti/TiN layer (or Ti/WN layer) is formed by a sputtering method, but the sputtered Ti/TiN layer has poor step coverage and it is also difficult to control the thickness thereof within atomic layer unit tolerances. Although the CVD (chemical vapor deposition) method exhibits good step coverage compared with the sputtering method, it is disadvantageous due to its high impurity content such as fluoride F (in case of WN) or chloride Cl (in case of TiN).

In an effort to solve the impurity problem, some have utilized methods involving increasing the deposition temperature to about 650° C. or more, or to employ a PE-CVD (plasma enhanced chemical vapor deposition) method. See, e.g., Steven D. Marcus et al., "Characterization of Low Pressure Chemically Vapor-Deposited Tungsten Nitride Films", Thin Solid Films 236, pp. 330 to 333 (1993). In Marcus et al., the WN film is formed at a temperature of about 650° C. or more so as to suppress the high impurity content, i.e., fluoride (F). However, the method has some drawbacks, for example, a high thermal budget, difficulty in maintaining the apparatus, and particle content.

On the other hand, the PE-CVD (plasma enhanced chemical vapor deposition) method exhibits poor step coverage compared with the thermal CVD method.

U.S. Pat. No. 4,058,430 discloses an ALD (atomic layer deposition) method. Like the CVD method, the ALD method relies on a chemical reaction between various precursor gases. However, unlike the CVD method, the gases in the ALD method are not mixed in a chamber, but rather the gases are introduced into the chamber one after another in pulses. In other words, as distinct from the CVD method, in the ALD method the precursors are introduced on the substrate alternately.

For example, suppose that a layer C is formed by using gases A and B in the ALD method. First, only the gas A is introduced into the chamber and then the gas A is chemisorbed into a semiconductor substrate. After that, the gas B is introduced in the chamber and then chemisorbed into the semiconductor substrate, thereby forming the layer C. For this reason, regardless of the surface morphology, the ALD layer always has an excellent step coverage, i.e., 100%.

M. Ritala et al., "Atomic Layer Epitaxy Growth of TiN Thin Films", J. Electrochem. Soc. Vol. 142 No.8, pp.2731 to 2737 (1995), employs an ALD method and states that a TiN layer can be formed at a lower temperature of 500° C., compared with 650° C. or more in the CVD method, and with a low impurity content. However, Ritala et. al. has a low deposition rate of 0.2 Å/Cyc when a TiN layer is deposited by the ALD method.

Accordingly, there exists a need to form the Ti layer (ohmic contact layer) by a suitable method other than the ALD method, for example a sputtering method, and then subsequently form an ALD-TiN layer as a metal barrier layer without causing defects in the ohmic contact layer, while increasing the deposition rate of the TiN layer.

SUMMARY OF THE INVENTION

It is an object of the invention to provide a method of fabricating a metal interconnection in a semiconductor device and an apparatus of fabricating thereof.

Another object of the invention is to provide a metal barrier layer having good step coverage, without impurities in the layer.

Another object of the invention is to provide a conductive layer which is in ohmic contact with an underlying semiconductor substrate.

Another object of the invention is to prevent defects in a conductive layer, used for an ohmic contact layer, during the formation of a metal barrier layer by forming a protective layer on the conductive layer.

Another object of the invention is to form a conductive layer used for an ohmic contact layer and a metal barrier layer through in-situ processes.

In accordance with the present invention, a method is provided for fabricating a metal interconnection in a semiconductor device which includes forming a contact hole for metal interconnection by etching an interlayer insulating film previously formed on a semiconductor substrate. A conductive layer, used as an ohmic contact layer, is formed on the interlayer insulating film including the contact hole. The conductive layer is a Ti (titanium) layer, and is formed by a sputtering or a PE-CVD (plasma enhanced chemical vapor deposition) method. A protective layer, for example, a TiN (titanium nitride) layer, is formed on the conductive layer by an RTN (rapid thermal nitridation) method or a plasma method. The RTN or plasma methods are performed in either a $N_2$ (nitrogen) or $NH_3$ (ammonia) ambient. An ALD (atomic layer deposition)-metal barrier layer is formed on the protective layer.

The step of forming the ALD metal barrier layer includes: (a) chemisorbing a first precursor on the protective layer; (b) purging any non-chemisorbed first precursor; (c) chemisorbing a second precursor on the protective layer; (d) purging any non-chemisorbed second precursor; (e) reacting the chemisorbed first precursor and second precursors to induce a ligand exchange; (f) purging any byproduct resulting from the ligand exchange; and (g) repeating the steps (a) to (f) until a predetermined thickness of metal barrier layer is obtained.

The first precursor is one of a Ti (titanium)-precursor and a W-precursor. The Ti-precursor is one of a halide material such as $TiCl_4$ and a metal-organic material, and the W-precursor includes $WF_6$ (tungsten hexafluoride). The second precursor includes an N-precursor including $NH_3$ and $N_2H_4$. The purging gas includes Ar and $N_2$.

In another aspect of the present invention, there is provided an apparatus for use in fabricating a metal interconnection in a semiconductor device wherein an ohmic contact layer and a metal barrier layer are sequentially formed within a contact hole opened in an interlayer insulating film previously formed on a semiconductor substrate. The apparatus includes a load lock chamber for loading a wafer into a process chamber, a chamber for forming the ohmic contact layer, a chamber for forming the protective layer on the conductive layer, a chamber for forming the metal barrier layer, and a transfer chamber for transferring the wafer among the chambers. The ohmic contact layer forming chamber is one of a Ti sputtering chamber and a Ti plasma-CVD chamber, and the protective layer forming chamber is one of an RTN chamber and a nitride layer forming plasma chamber. The metal barrier layer forming chamber is one of an ALD-TiN chamber and an ALD-WN chamber, and each is a batch type chamber respectively forming barrier metal layers on several wafers through one process step. Preferably, the metal barrier layer formation is performed at a temperature of about 300° C. to 600° C. and a pressure of about 2 mTorr to 10 mTorr. The apparatus can further comprise a degassing chamber, an Al-CVD chamber, and a W-CVD chamber.

In another aspect of the present invention, the metal barrier layer is formed by an ALD method at low temperature of about 500° C., compared with about 650° C. in the conventional CVD method, thereby providing good step coverage with no impurities. Also, the protective layer, which is formed before the ALD metal barrier layer formation, prevents defects in the underlying ohmic contact layer. dr

BRIEF DESCRIPTION OF THE DRAWINGS

The invention may be understood and its objects will become apparent to those skilled in the art by reference to the accompanying drawings as follows:

FIG. 4 is a graph showing the relationship between the step coverage and the aspect ratio, wherein the plots of squares illustrate the ALD barrier layer and the plots of triangles illustrate the CVD barrier layer;

DETAILED DESCRIPTION OF THE PREFERRED EMBODIMENTS

The preferred embodiment of the present invention will now be described with reference to the accompanying drawings.

Figure 1A:
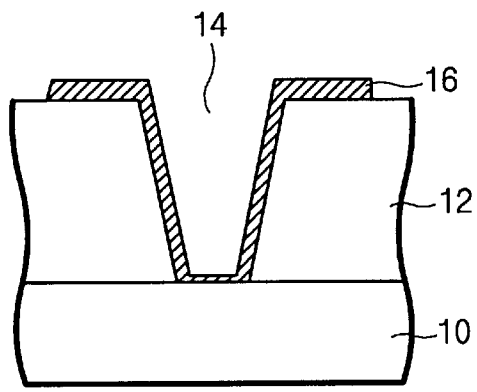
FIG. 1A, FIG. 1B and FIG. 1C are sequential side views of a portion of a semiconductor device showing a novel method of fabricating a metal interconnection according to an embodiment of the present invention.
Figure 1B:
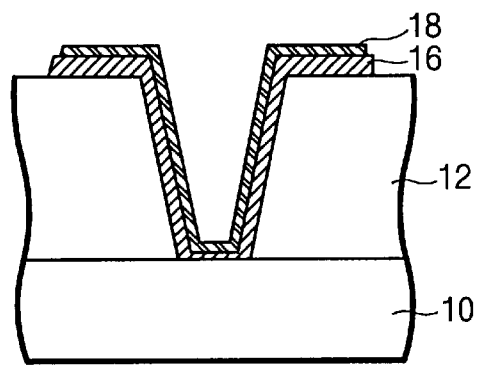
Figure 1C:
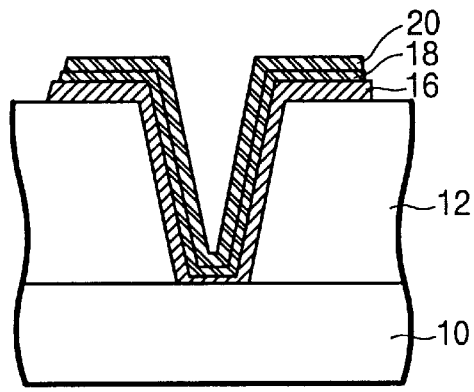

FIG. 1A, FIG. 1B and FIG. 1C are sequential side views of a portion of a semiconductor device showing a novel method of fabricating a metal interconnection according to an embodiment of the present invention. As shown in FIG. 1A, an interlayer insulating film 12 is formed on a semiconductor substrate 10. A contact hole 14 for metal interconnection is formed in the interlayer insulating film 12 via conventional etching techniques know to those of skill in the art. A conductive layer 16, for example, a Ti (titanium) layer, is then formed on the interlayer insulating film 12 including the contact hole 14. Note that the conductive layer 16 is in ohmic contact with the underlying semiconductor substrate 10. The Ti layer 16 may be formed by a Ti-sputtering or Ti-plasma CVD method. In the Ti-plasma CVD method, $TiCl_4$ and reacting gases are mixed and introduced into the chamber, thereby forming the Ti layer 16 through a plasma reaction. The reacting gases comprise mixed gases containing argon and $H_2$, $SiH_4$, and $Si_2H_6$. Although the Ti layer 16 has poor step coverage compared with an ALD (atomic layer deposition) layer, it is inconsequential to the operation of the present invention because the thickness of the Ti layer 16 is kept to a minimum, and merely needs to be of sufficient thickness to form an ohmic contact.

Referring to FIG. 1B, a protective layer 18 is formed on the Ti layer 16 so as to protect the Ti layer 16 before forming an ALD-metal barrier layer 20. The protective layer 18 includes a metal nitride layer and is formed by nitriding an upper surface of the Ti layer 16. The nitriding process may employ an RTN (rapid thermal nitridation) method in $N_2$ (nitrogen) or $NH_3$ (ammonia) ambient, or a plasma method in $N_2$ or $NH_3$ ambient.

The protective layer 18 serves as a barrier layer for impurities such as F (fluoride) when a subsequent WN (tungsten nitride) ALD-metal barrier layer is formed, or Cl (chloride) when a subsequent TiN (titanium nitride) ALD-metal barrier layer is formed. The impurities (i.e., F or Cl) are generated by precursors such as $TiCl_4$ when forming the TiN layer, or $WF_6$ when forming the WN layer. If the protective layer is not formed, the F or Cl precursor impurities would attack and erode the Ti layer 16.

The metal barrier layer 20 (i.e., either a TiN or WN layer) is formed on the protective layer 18 by the ALD method, thereby forming an ohmic contact layer and metal barrier layer interface for metal interconnection, as shown in FIG. 1C.

The method of forming the ALD-metal barrier layer 20 will be described in detail with reference to FIG. 2A to FIG. 2F and FIG. 3.

Figure 2A:
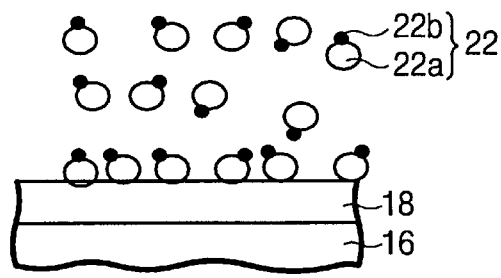
FIG. 2A, FIG. 2B, FIG. 2C, FIG. 2D, FIG. 2E and FIG. 2F are sequential side views of a portion of a semiconductor device showing a process of forming a metal barrier layer illustrated in FIG. 1C.
Figure 2B:
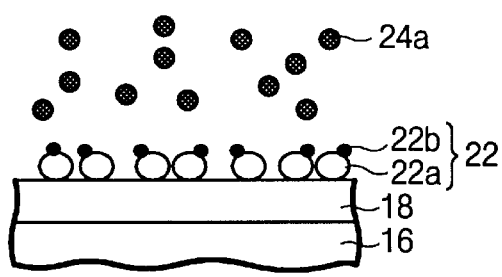
Figure 2C:
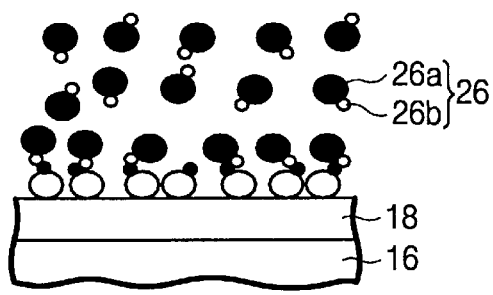
Figure 2D:
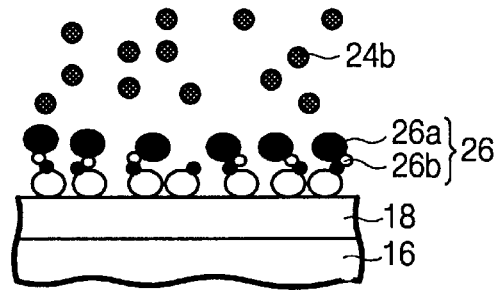
Figure 2E:
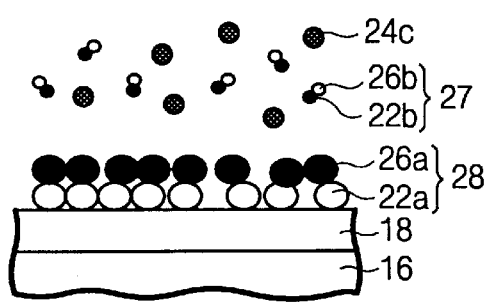
Figure 2F:
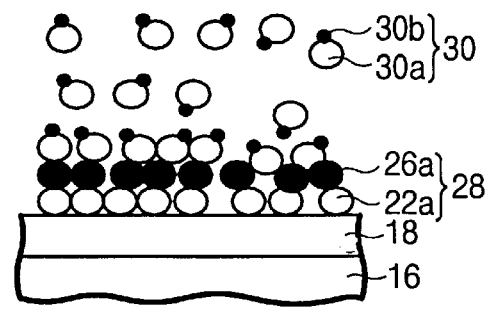
Figure 3:
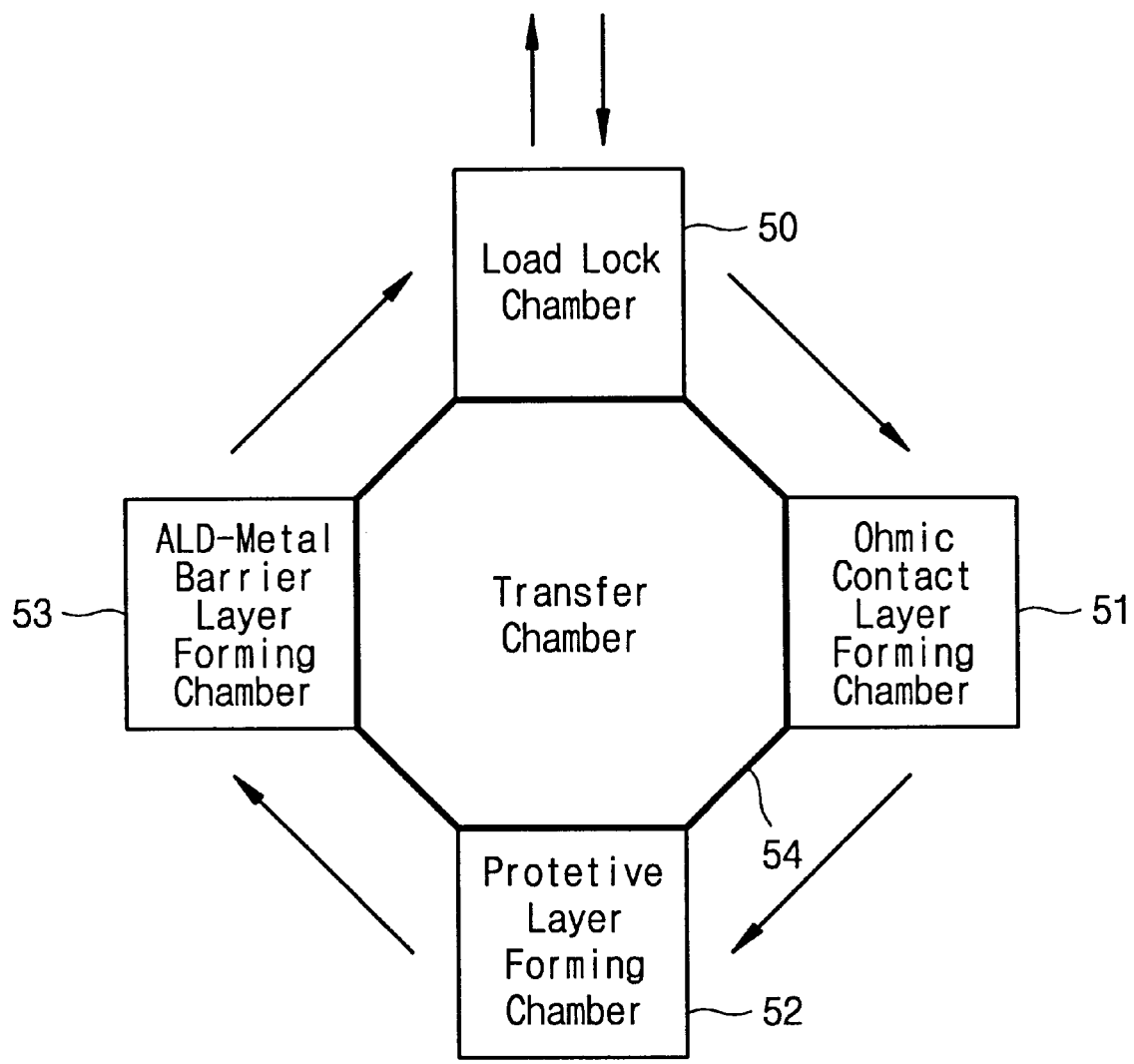
FIG. 3 is a schematic view of an apparatus for use in fabricating a metal interconnection in a semiconductor according to an embodiment of the present invention.

FIG. 2A to FIG. 2F are sequential side views of a portion of a semiconductor device showing a process of forming the metal barrier layer 20 illustrated in FIG. 1C, and FIG. 3 is a schematic view of an apparatus for use in fabricating the metal interconnection.

Referring to FIG. 3, the cluster tool for forming the ohmic contact layer/metal barrier layer through an in-situ process includes load lock chamber 50, ohmic contact layer forming chamber 51, protective layer forming chamber 52, ALD-metal barrier layer forming chamber 53, and transfer chamber 54.

After being loaded into the load lock chamber 50, a wafer cassette is transferred to the ohmic contact layer forming chamber 51, via the transfer chamber 54, where the Ti layer 16 is formed. Thereafter, the wafer cassette is transferred to the protective layer forming chamber 52, via the transfer chamber 54, where the TiN layer 18 is formed. The ohmic contact layer forming chamber 51 is either a Ti-sputtering chamber or Ti-plasma deposition chamber, and the protective layer forming chamber 52 is either an RTN chamber or a plasma chamber using $N_2$ or $NH_3$ ambient.

The wafer cassette is then transferred to the ALD-metal barrier layer forming chamber 53, via the transfer chamber 54, where the ALD-metal barrier layer 20 is formed. The ALD-metal barrier layer forming chamber 53 is either an ALD-TiN chamber or an ALD-WN chamber.

It is readily apparent that the cluster tool may comprise many different configurations resulting from employing different combinations of the ohmic contact 51, protective layer 52, and ALD-metal layer 53 forming chambers. In other words, the cluster tool would comprise the transfer chamber 54 and the load lock chamber 50, and include: (i) the Ti-sputtering chamber, the RTN chamber, and the ALD-TiN (or WN) chamber; or (ii) the Ti-plasma deposition chamber, the RTN chamber, and the ALD-TiN (or WN) chamber; or (iii) the Ti-sputtering chamber, the plasma chamber, and the ALD-TiN (or WN) chamber; or (iv) the Ti-plasma deposition chamber the plasma chamber, and the ALD-TiN (or WN) chamber.

The process of forming the ALD layer 20 will now be described with reference to FIG. 2A to FIG. 2F.

First, when the wafer is transferred into the ALD-metal barrier chamber 53, the temperature of the chamber 53 is adjusted to about 300° C. to 600° C. and the pressure thereof is adjusted to about 2 mTorr to 10 mTorr using nitrogen or argon gas.

Referring to FIG. 2A, a Ti-precursor (or W-precursor) 22 is introduced into the chamber 53, thereby being chemisorbed on the protective layer 18. The Ti-precursor 22 includes a halide material such as $TiCl_4$ or a metal-organic material containing Ti, while the W-precursor 22 includes $WF_6$. In the figures, the Ti-precursor 22 comprises Ti 22a and Cl 22b in one embodiment, and the W-precursor 22 comprises W 22a and F 22b in another embodiment.

In FIG. 2B, non-chemisorbed Ti-precursor (or W-precursor) is purged by a purging gas 24a such as Ar (argon) or $N_2$.

In FIG. 2C, an N-precursor 26 is introduced into the ALD-metal barrier layer chamber 53, thereby being chemisorbed on the protective layer 18. The N-precursor 26 includes $NH_3$ and $N_2H_4$. The N-precursor 26 comprises N 26a and H 26b.

In FIG. 2D, non-chemisorbed N-precursor is purged by purging gas 24b such as Ar or $N_2$.

A ligand exchange reaction occurs between the chemisorbed Ti-precursor (or W-precursor) and the chemisorbed N-precursor, thereby forming an atomic layer, i.e., TiN (or WN) metal barrier layer 28 on the protective layer 18, as shown in FIG. 2E. However, the ligand exchange reaction causes undesirable byproducts, i.e., HCl (or HF) 27, which comprises H ligand 26b from N-precursor 26 and Cl (or F) ligand 22b from Ti-precursor (or W-precursor) 22. The byproduct 27 is purged by purging gas 24c such as Ar or $N_2$.

The above mentioned steps constitute a cycle for forming the TiN (or WN)-metal barrier layer 28 and the desired thickness thereof is achieved by repeating the cycle. FIG. 2F shows that additional $TiCl_4$ (or $WF_6$) 30 is introduced into the chamber 53, thereby being chemisorbed on the TiN (or WN) layer 28, after one cycle for forming the TiN (or WN) metal barrier layer 28. Reference numerals 30a and 30b are comprised of the same constituents as reference numerals 22a and 22b. The present invention achieves a deposition rate of 1 to 100 Å/cyc by maintaining the pressure in the chamber at 2 mTorr to 10 mTorr, as compared to the 0.2 Å/cyc deposition rate of the prior art.

The step of forming the ALD-TiN (or WN) layer 28 can be performed in a batch type process which respectively forms the ALD-TiN (or WN) barrier metal layers 28 over several wafers during one processing step. This is because the TiN (or WN) layer 28 forming process is not affected by the structure of the chamber and gas fluid dynamics, due to a slow rate of deposition thereof and the chemisorption mechanism. On the other hand, the steps of forming the Ti layer 16 and the TiN layer 18 are performed on the wafers one-by-one.

Alternatively, the cluster tool can further include a conventional Al (aluminium)-CVD chamber for forming a subsequent metal line, a W (tungsten)-CVD, and a degassing chamber.

FIG. 4 is a graph showing the relations hip between the step coverage and the aspect ratio, wherein the plots of squares 56b illustrate the ALD barrier layer and the plots of triangles 56a illustrate the CVD barrier layer. The step coverages of the ALD layer and CVD layer are measured under the same condition, i.e., $WF_6$ at 10 sccm, $NH_3$ at 500 sccm, $N_2$ at 100 sccm, the substrate temperature at about 400° C., and the depth of the contact hole about 1.2 μm. As illustrated in FIG. 4, the step coverages of the ALD layer and CVD layer decrease with increasing the aspect ratio. However, the ALD barrier layer 56b has good step coverage compared with that of the CVD barrier layer 56a. An incomplete purging process can result in process errors which can prevent the ALD barrier layer step coverage 56b from reaching 100%.

Figure 5A:
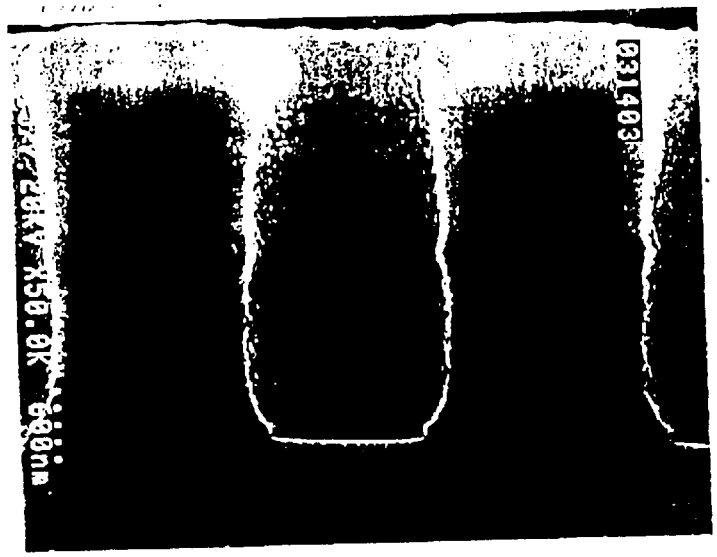
FIG. 5A and FIG. 5B are cross-sectional SEM (scanning electronic microscope) images of the step coverage of the CVD barrier layer and the ALD barrier layer, respectively.
Figure 5B:
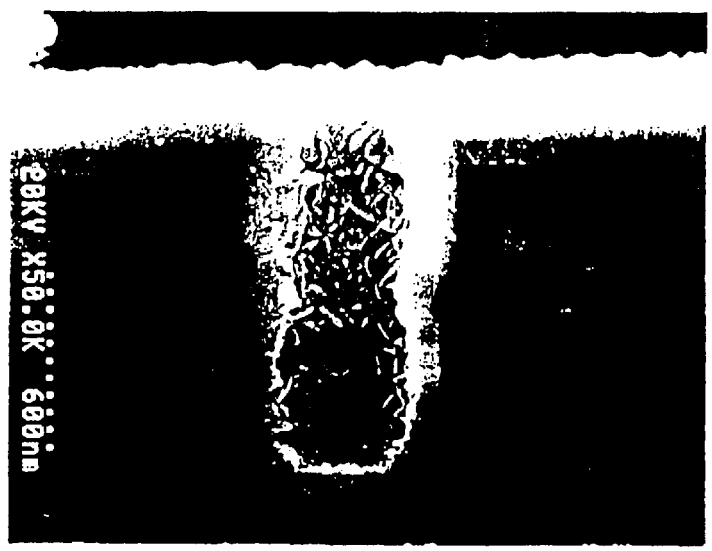

FIG. 5A and FIG. 5B are cross-sectional SEM (scanning electronic microscope) images of the step coverage of the CVD barrier layer and the ALD barrier layer.

Referring to FIG. 5A, in case of the CVD barrier layer (WN layer), the upper edge portion of the contact hole is relatively thick compared with the other portions, thereby forming a non-uniform CVD layer. On the other hand, as shown in FIG. 5B, the ALD layer (WN layer) has a uniform thickness in the trench, thereby achieving good step coverage.

Figure 6:
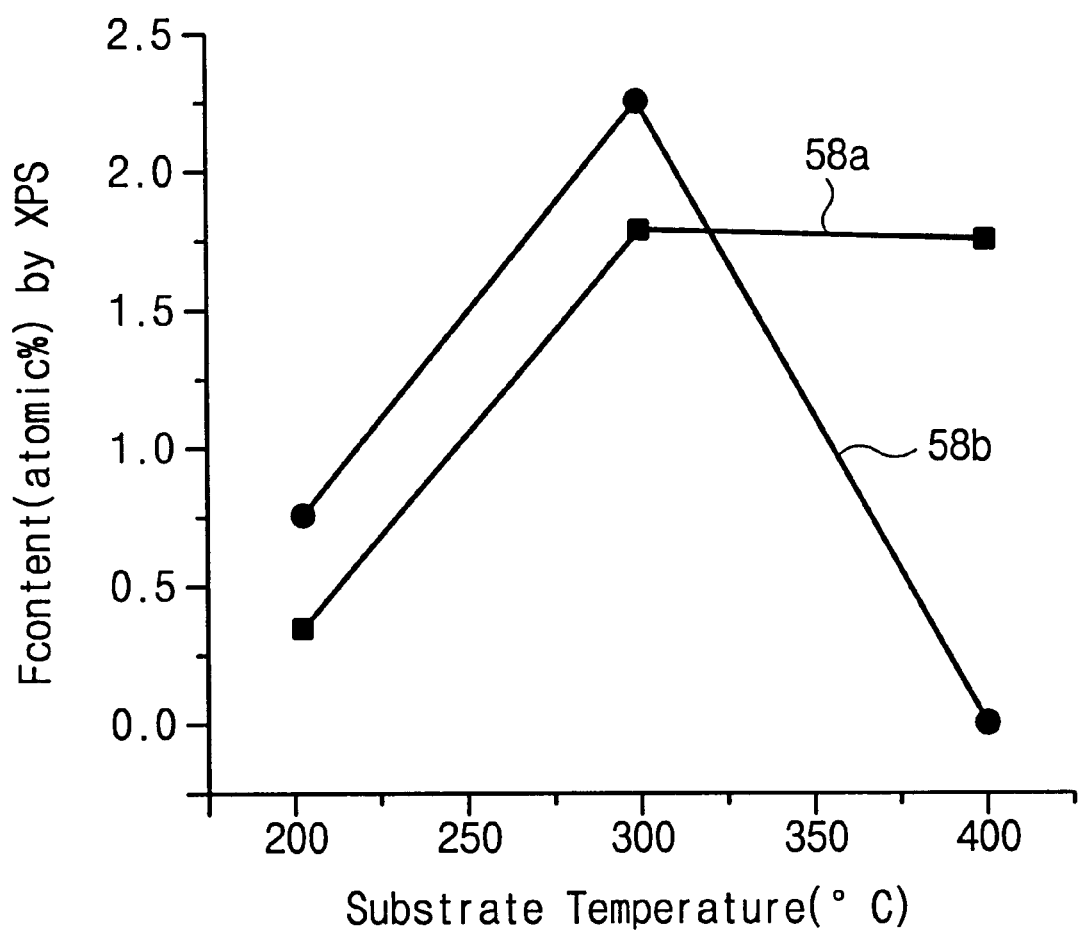
FIG. 6 is a graph showing the relationship between fluorine content and the depositing temperature, wherein the plots of circles illustrate the ALD barrier layer and the plots of squares illustrate the CVD barrier layer.

FIG. 6 is a graph showing the relationship between fluorine content and the depositing temperature, wherein the plots of circles 58b illustrate the ALD barrier layer and the plots of squares 58a illustrate the CVD barrier layer. In FIG. 6, the fluorine content of the ALD WN layer and CVD WN layer are measured by XPS (X-Ray Photoelectron Spectroscopy) under the same condition, i.e., $WF_6$ at 10 sccm, $NH_3$ at 500 sccm, $N_2$ at 100 sccm, with a deposition temperature ranging from 200° C. to 400° C.

For the CVD WN barrier layer 58a, the fluorine content increases when increasing the temperature from 200° C. to 300° C., but then remains nearly constant in the temperature range between 300° C. to 400° C. On the other hand, for the ALD WN barrier layer 58b, the fluorine content increases when increasing the temperature from 200° C. to 300° C. like the CVD WN barrier layer, but decreases remarkably when increasing the temperature from 300° C. to 400° C., and practically to about 0.0 (the detection limit of the XPS) at 400° C. For this reason, it is possible to form the ALD barrier layer without resulting impurities at a low temperature of about 500° C. or less. This temperature is lower than the temperature (more than 650° C.) for forming the CVD barrier layer by 150° C.

Accordingly, in accordance with the present invention, an ALD barrier layer exhibiting good step coverage can be formed without resulting impurities at a low temperature of about 500° C. or less. A protective layer is initially formed before forming the ALD barrier layer, thereby preventing defects in an ohmic contact layer underlying the protective layer.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a metal interconnection in a semiconductor device comprising:

etching a contact hole in an insulating film layer formed on a semiconductor substrate, the contact hole exposing a surface region of the semiconductor substrate;

forming a conductive layer on the insulating film layer and the contact hole such that the conductive layer is in ohmic contact with the semiconductor substrate;

forming a protective layer on the conductive layer by nitriding an upper surface of the conductive layer; and forming a metal barrier layer, by atomic layer deposition (ALD), on the protective layer.

2. The method according to claim 1, wherein the conductive layer comprises a titanium (Ti) layer.

3. The method according to claim 1, wherein the conductive layer is formed by one selected from the group consisting of a sputtering method and a plasma enhanced chemical vapor deposition (PE-CVD) method.

4. The method according to claim 1, wherein the protective layer comprises a metal nitride layer.

5. The method according to claim 1, wherein the protective layer is formed by a rapid thermal nitridation (RTN) method in an atmosphere selected from the group consisting of nitrogen ($N_2$) and ammonia ($NH_3$).

6. The method according to claim 1, wherein the protective layer is formed by a plasma method in an atmosphere selected from the group consisting of nitrogen ($N_2$) and ammonia ($NH_3$).

7. The method according to claim 1, wherein said forming the metal barrier layer comprises:

(a) chemisorbing a first precursor on the protective layer;

(b) purging any non-chemisorbed first precursor using a purge gas;

(c) chemisorbing a second precursor on the protective layer;

(d) purging any non-chemisorbed second precursor using the purge gas;

(e) reacting the chemisorbed first precursor and second precursors to induce a ligand exchange among the first and second precursors;

(f) purging byproduct resulting from said reacting using the purge gas; and (g) repeating steps (a) to (f) to increase the thickness of a metal barrier layer.

8. The method according to claim 7, wherein the first precursor is one selected from the group consisting of a Ti-precursor and a W-precursor.

9. The method according to claim 8, wherein the Ti-precursor is one selected from the group consisting of a halide material and a metal-organic material.

10. The method according to claim 8, wherein the W-precursor comprises $WF_6$.

11. The method according to claim 7, wherein the second precursor comprises an N-precursor.

12. The method according to claim 11, wherein the N-precursor is one selected from the group consisting of $NH_3$ and $N_2H_4$.

13. The method according to claim 7, wherein the purge gas is one selected from a group consisting of argon (Ar) and nitrogen ($N_2$).

14. The method according to claim 7, wherein during said forming the metal barrier layer, the protective layer is operative to prevent defects in the conductive layer caused by a ligand exchange among the first and second precursors used for forming the metal barrier layer.

15. The method according to claim 14, wherein the protective layer comprises a titanium nitride (TiN) layer.

16. An apparatus used in fabricating a metal interconnection in a semiconductor device, the semiconductor device having an ohmic contact layer and a metal barrier layer sequentially formed within a contact hole etched in an insulating layer formed on a semiconductor substrate, the apparatus comprising:

a transfer chamber;

a load lock chamber for loading and unloading a wafer into the transfer chamber;

a first process chamber, for forming the ohmic contact layer on the wafer, connected to the transfer chamber;

a second process chamber, for forming a protective layer on the ohmic contact layer, connected to the transfer chamber; and a third process chamber, for forming the metal barrier layer on the protective layer, connected to the transfer chamber;

wherein the third process chamber is one selected from the group consisting of an atomic layer deposition (ALD)-titanium nitride (TiN) chamber and an atomic layer deposition (ALD)-tungsten nitride (WN) chamber.

* * * * *